(12) United States Patent
Chen et al.

(10) Patent No.: US 11,825,635 B2
(45) Date of Patent: Nov. 21, 2023

(54) IMMERSION LIQUID COOLING SYSTEM

(71) Applicant: Quanta Computer Inc., Taoyuan (TW)

(72) Inventors: Chao-Jung Chen, Taoyuan (TW);
Yu-Nien Huang, Taoyuan (TW);
Chang-Yu Chiang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 157 days.

(21) Appl. No.: 17/453,063

(22) Filed: Nov. 1, 2021

(65) Prior Publication Data
US 2023/0046075 A1 Feb. 16, 2023

Related U.S. Application Data

(60) Provisional application No. 63/260,305, filed on Aug. 16, 2021.

(51) Int. Cl.
*H05K 7/20* (2006.01)
*G06F 1/20* (2006.01)

(52) U.S. Cl.
CPC ..... *H05K 7/20781* (2013.01); *H05K 7/20272* (2013.01); *G06F 1/203* (2013.01)

(58) Field of Classification Search
None
See application file for complete search history.

(56) References Cited

U.S. PATENT DOCUMENTS

| 9,064,846 | B2 * | 6/2015 | Nagai | H01L 23/473 |
| 9,888,617 | B2 * | 2/2018 | Ishiyama | H01L 23/473 |
| 9,986,665 | B2 * | 5/2018 | Kosaka | H05K 7/209 |

(Continued)

FOREIGN PATENT DOCUMENTS

| CN | 1225232 A | 8/1999 |
| CN | 112099591 A | 12/2020 |
| FR | 2833803 A1 | 6/2003 |

OTHER PUBLICATIONS

TW Office Action for Application No. 111113815, dated Jan. 4, 2023, w/ First Office Action Summary.

(Continued)

*Primary Examiner* — Courtney L Smith
(74) *Attorney, Agent, or Firm* — NIXON PEABODY LLP

(57) ABSTRACT

A liquid cooling system includes a liquid coolant conduit in proximity to heat-generating electrical components within an enclosed space. The conduit allows circulation of a liquid coolant to extract heat from the heat-generating components. The heat-generating components includes at least one first heat-generating electrical component and at least one second heat-generating electrical component. The first heat-generating component produces greater heat than the second heat-generating component. The enclosed space includes an inlet and an outlet. The conduit includes a nozzle fluidly connected to the inlet. The nozzle is located within the enclosed space. The nozzle forms first and second aperture sets. The first aperture set directs the liquid coolant to the first heat-generating component. The second aperture set directs the liquid coolant to the second heat-generating component. The nozzle allows liquid coolant to pass the first heat-generating component at a faster rate than the second heat-generating component.

19 Claims, 4 Drawing Sheets

(56) References Cited

U.S. PATENT DOCUMENTS

| | | | |
|---|---|---|---|
| 10,462,939 B2* | 10/2019 | Ushijima | F28F 9/026 |
| 2002/0112497 A1 | 8/2002 | Patel et al. | |
| 2014/0158324 A1* | 6/2014 | Tochiyama | H01L 23/473 |
| | | | 165/67 |
| 2017/0231115 A1* | 8/2017 | Kobayashi | F28F 1/40 |
| 2022/0173012 A1* | 6/2022 | Ushijima | H05K 7/20 |

OTHER PUBLICATIONS

TW Search Report for Application No. 111113815, dated Jan. 4, 2023, w/ First Office Action.

\* cited by examiner

IMMERSION LIQUID COOLING SYSTEM

CROSS REFERENCE TO RELATED APPLICATION

This application claims priority to and the benefits of U.S. Provisional Patent No. 63/260,305 filed on Aug. 16, 2021, titled "Liquid Jet Design Immersion Cooling", the contents of which are hereby incorporated by reference herein in their entirety.

FIELD OF THE INVENTION

The present disclosure relates generally to a cooling system for information technology (IT) systems. More particularly, aspects of this disclosure relate to an immersion liquid cooling system that efficiently assists in cooling of electronic component.

BACKGROUND OF THE INVENTION

Computer components, such as servers, include numerous electronic components that are powered by a common power supply. Servers generate an enormous amount of heat due to the operation of internal electronic devices such as controllers, processors, memory, and the like. Overheating from the inefficient removal of such heat has the potential to shut down or impede the operation of such devices. Due to the improvement of high-performance systems, the amount of heat that needs to be removed becomes higher with each new generation of electronic components. With the advent of more powerful components, traditional air cooling in combination with fan systems is inadequate to sufficiently remove heat generated by newer generation components.

Liquid cooling is the currently accepted solution for rapid heat removal due to the superior thermal performance from liquid cooling. Liquid cooling is more effective in absorbing and transporting heat from heat-generating components, and allows heat removal without noise pollution. Problems that can occur using liquid cooling systems include its efficiency in cooling both higher and lower heat-generated electrical components and/or situations where the higher heat-generated electrical components are not cooled adequately.

Thus, there is a need for a liquid cooling system that overcomes such problems in cooling both higher and lower heat-generated electrical components.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to one aspect of the present disclosure, a liquid cooling system comprises a liquid coolant conduit in proximity to a plurality of heat-generating electrical components contained within an enclosed space. The liquid coolant conduit allows circulation of a liquid coolant to extract heat from the plurality of heat-generating electrical components. The plurality of heat-generating electrical components includes at least one first heat-generating electrical component and at least one second heat-generating electrical component. The at least one first heat-generating electrical component produces greater heat than the at least one second heat-generating electrical component. The enclosed space includes an inlet and an outlet. The liquid coolant conduit includes a nozzle fluidly connected to the inlet. The nozzle is located within the enclosed space. The nozzle forms a first set of at least one aperture and a second set of at least one aperture. The first set of at least one aperture directs the liquid coolant to the at least one first heat-generating electrical component. The second set of at least one aperture directs the liquid coolant to the at least one second heat-generating component. The nozzle is configured and located to allow liquid coolant to pass the at least one first heat-generating electrical component at a faster rate than the at least one second heat-generating electrical component.

According to a configuration of the above implementation, the first set of at least one aperture is a plurality of apertures, and the second set of at least one aperture is a plurality of apertures.

According to another configuration of the above implementation, the first set of at least one aperture has a greater number of apertures than the second set of at least one aperture.

In a further implementation, the first set of at least one aperture has from about 10 to about 20 apertures. In yet another implementation, the second set of at least one aperture has from about 3 to about 8 apertures.

In yet another implementation, the first set of at least one aperture is a non-polygonal shape. In a further implementation, the first set of at least one aperture is a polygonal shape.

In one implementation, the at least one first heat-generating electrical component produces from about 3 to about 300 times as much heat than the at least one second heat-generating electrical component. In a further embodiment, the at least one first heat-generating electrical component produces from about 5 to about 50 times as much heat than the at least one second heat-generating electrical component.

In a further aspect of the above implementation, the nozzle further includes a partition.

According to another aspect of the present disclosure, a computer system includes a plurality of heat-generating electrical components and a liquid cooling system. The plurality of heat-generating electrical components includes at least one first heat-generating electrical component and at least one second heat-generating electrical component. The liquid cooling system comprises a liquid coolant conduit in proximity to the plurality of heat-generating electrical components contained within an enclosed space. The liquid coolant conduit allows circulation of a liquid coolant to extract heat from the plurality of heat-generating electrical components. The at least one first heat-generating electrical component produces greater heat than the at least one second heat-generating electrical component. The enclosed space includes an inlet and an outlet. The liquid coolant conduit includes a nozzle fluidly connected to the inlet. The nozzle is located within the enclosed space. The nozzle forms a first set of at least one aperture and a second set of at least one aperture. The first set of at least one aperture directs the liquid coolant to the at least one first heat-generating electrical component. The second set of at least one aperture directs the liquid coolant to the at least one second heat-generating component. The first set of at least one aperture allowing the liquid coolant to pass the at least one first heat-generating electrical component at a faster rate than the second set of at least one aperture allows the liquid coolant to pass the at least one second heat-generating electrical component.

In a further aspect of the above implementation, the plurality of heat-generating electrical components is a plurality of servers.

According to a configuration of the above implementation, the first set of at least one aperture is a plurality of apertures, and the second set of at least one aperture is a plurality of apertures.

According to another configuration of the above implementation, the first set of at least one aperture has a greater number of apertures than the second set of at least one aperture.

In a further implementation, the first set of at least one aperture has from about 10 to about 20 apertures. In yet another implementation, the second set of at least one aperture has from about 3 to about 8 apertures.

In one implementation, the at least one first heat-generating electrical component produces from about 3 to about 300 times as much heat than the at least one second heat-generating electrical component.

In a further aspect of the above implementation, the nozzle further includes a partition.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1A:
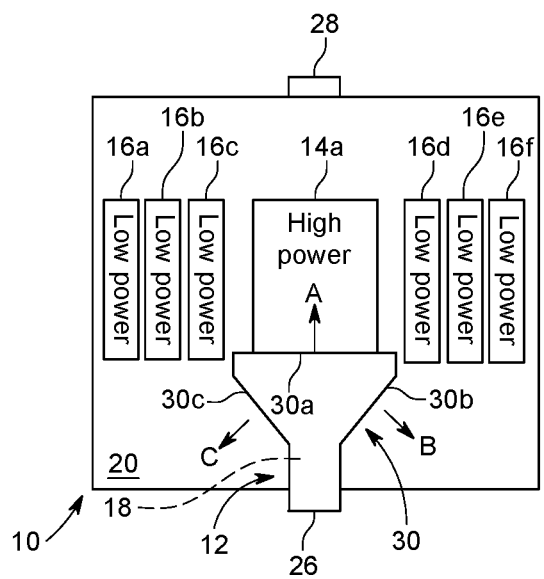
FIG. 1A is a schematic top view of a liquid cooling system, according to one embodiment.

According to one aspect of the present disclosure, a liquid cooling system comprises a liquid coolant conduit in proximity to a plurality of heat-generating electrical components contained within an enclosed space. The liquid coolant conduit allows circulation of a liquid coolant to extract heat from the plurality of heat-generating electrical components. The plurality of heat-generating electrical components includes at least one first heat-generating electrical component and at least one second heat-generating electrical component. The at least one first heat-generating electrical component produces greater heat than the at least one second heat-generating electrical component. The enclosed space includes an inlet and an outlet. The liquid coolant conduit includes a nozzle fluidly connected to the inlet. The nozzle is located within the enclosed space. The nozzle forms a first set of at least one aperture and a second set of at least one aperture. The first set of at least one aperture directs the liquid coolant to the at least one first heat-generating electrical component. The second set of at least one aperture directs the liquid coolant to the at least one second heat-generating component. The nozzle is configured and located to allow liquid coolant to pass the at least one first heat-generating electrical component at a faster rate than the at least one second heat-generating electrical component.

The liquid cooling system is configured to protect information technology (IT) systems. The liquid cooling system is typically a closed-loop system. Non-limiting examples of information technology (IT) systems include, but are not limited to, servers, computer systems, network switches, stand-alone computers, or storage units (e.g., just a bunch of disks (JBOD)). In one embodiment, a server includes memory, a processor, a cooling fan, a power supply, heat syncs, and a chassis.

Non-limiting examples of heat-generating components include, but are not limited to, storage servers, application servers, switches, and other electronic devices. Examples include, but are not limited to, central processing units (CPU), dual in-line memory modules (DIMM), network cards, hard disk drives (HDD), solid state drives (SSD), graphics processing units (GPU) or field programmable gate arrays (FPGA). It is contemplated that other heat-generating electrical components may be cooled by the liquid cooling system of the present application.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Referring to FIG. 1A, a schematic top view of a liquid cooling system 10 is shown according to one embodiment. The liquid cooling system 10 includes a liquid coolant conduit 12. The liquid coolant conduit 12 is in proximity to a first heat-generating electrical component 14a and second heat-generating electrical components 16a-16f contained within an enclosed space 20. The enclosed space 20 includes an inlet 26 and an outlet 28.

The liquid coolant conduit 12 allows circulation of a liquid coolant 18 to extract heat from the first and second heat-generating electrical components 14a, 16a-16f. The first heat-generating electrical component 14a produces greater heat than each of the second heat-generating electrical components 16a-16f.

The first heat-generating electrical component 14a produces at least 3 times as much heat as each of the second heat-generating electrical components 16a-16f in one embodiment. The first heat-generating electrical component 14a produces at least 5 or at least 10 times as much heat as each of the second heat-generating electrical components 16a-16f in another embodiment. The first heat-generating electrical component 14a produces at least 100 times as much heat as each of the second heat-generating electrical components 16a-16f in a further embodiment.

The first heat-generating electrical component 14a produces from about 3 to about 300 times as much heat as each of the second heat-generating electrical components 16a-16f in one embodiment. The first heat-generating electrical component 14a produces from about 3 to about 100 times as much heat as each of the second heat-generating electrical components 16a-16f in another embodiment. The first heat-generating electrical component 14a produces from about 10 to about 50 times as much heat as each of the second heat-generating electrical components 16a-16f in a further embodiment.

In one embodiment, the first heat-generating electrical component 14a is generally from about 100 to about 3,000 Watts. The first heat-generating electrical component 14a is generally from about 100 to about 1,000 Watts in another embodiment. The first heat-generating electrical component 14a is generally from about 200 to about 500 Watts in a further embodiment.

In one embodiment, the second heat-generating electrical components 16a-16f is generally from about 10 to about 30 Watts. The second heat-generating electrical components 16a-16f is generally from about 10 to about 20 Watts in another embodiment. The second heat-generating electrical components 16a-16f is from about 15 to about 30 Watts in a further embodiment.

The liquid coolant conduit 12 includes a nozzle 30 fluidly connected to the inlet 26. The nozzle 30 is located within the enclosed space 20 as shown in FIG. 1A. The nozzle 30 forms a first set of apertures 34 (FIG. 1B) and a second set of apertures 36 (FIG. 1C). The first set of apertures 34 directs the liquid coolant 18 from the nozzle 30 to the first heat-generating electrical component 14a. This is depicted using liquid flow arrow A in FIG. 1A. The second set of apertures 36 directs the liquid coolant 18 from the nozzle 30 to the second heat-generating electrical components 16a-16f. Specifically, the nozzle 30 has a front side 30a, a first side 30b, and a second side 30c. The front side 30a forms the first set of apertures 34 (FIG. 1B) therein, while the first side 30b forms the second set of apertures 36 (FIG. 1C) therein. The second side 30c forms a third set of apertures (not shown). In this embodiment, the third set of apertures are identical to the third set of apertures. This is shown as respective liquid flow arrows B, C in FIG. 1A. It is contemplated that the first, second and third sides may form different configurations of apertures in another embodiment.

The nozzle 30 is configured and designed to adjust the flow rate of the liquid coolant 18 into the first heat-generating electrical component 14a and into the plurality of second heat-generating electrical components 16a-16f. More specifically, the nozzle 30 is configured and located to allow the liquid coolant 18 to pass the first heat-generating electrical component 14a at a faster rate than the second heat-generating electrical components 16a-16f. The nozzle 30 assists the cooling system 10 in saving or reducing power when cooling the respective first and second heat-generated electrical components 14a, 16a-16f.

Referring back to FIG. 1B, the first set of apertures 34 includes exactly 12 generally circular apertures. The first set of apertures generally includes from about 10 to about 20 apertures, and generally from about 10 to about 16 apertures. Referring back to FIG. 1C, the second set of apertures 36 includes exactly 5 generally circular apertures. The second and third set of apertures generally include from about 3 to about 8 apertures, and generally from about 4 to about 8 apertures. It is contemplated that the number of first, second and third set of apertures may vary in number.

Figure 1B:
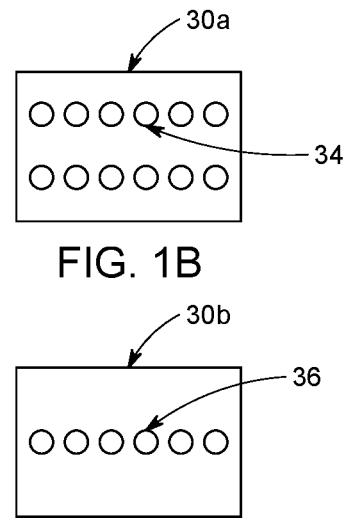
FIG. 1B is a schematic side view of a nozzle forming a plurality of apertures, according to one embodiment.
Figure 1C:
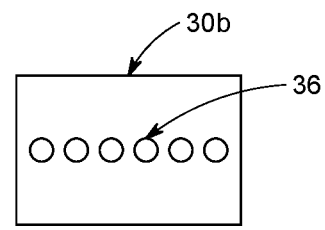
FIG. 1C is a schematic side view of a nozzle forming a plurality of apertures, according to another embodiment.

It is also contemplated that the first and second set of apertures 34, 36 formed in the nozzle 30 may be formed in different shapes and sizes than depicted in FIGS. 1B and 1C, respectively. The first and second sets of apertures may be formed in polygonal, non-polygonal shapes or a combination thereof. Some non-limiting examples of polygonal shapes that may be used in forming the first, second and third sets of apertures include squares, rectangles, triangles, and hexagons. Some non-limiting examples of non-polygonal shapes that may be used in forming the first, second and third sets of apertures include ovals and oblong shapes. It is contemplated In another embodiment, a nozzle may include exactly two sets of apertures in which a first set of apertures delivers liquid coolant to the at least one first heat-generating electrical component, and a second set of apertures delivers liquid coolant to the at least one second heat-generating electrical component. It is contemplated that a nozzle may have more than three sides with a corresponding number of sets of apertures in a further embodiment.

Figure 2A:
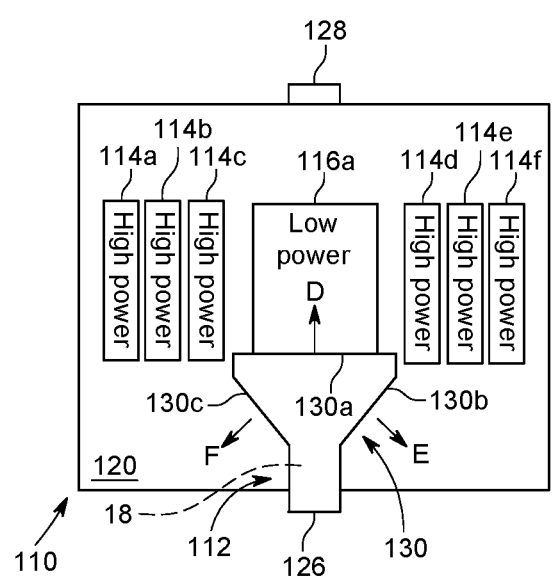
FIG. 2A is a schematic top view of a liquid cooling system, according to another embodiment.

Referring to FIG. 2A, a schematic top view of a liquid cooling system 110 is shown according to another embodiment. The liquid cooling system 110 includes a liquid coolant conduit 112. The liquid coolant conduit 112 is in proximity to first heat-generating electrical components 114a-114f and a second heat-generating electrical component 116a contained within an enclosed space 120. The enclosed space 120 includes an inlet 126 and an outlet 128.

The liquid coolant conduit 112 allows circulation of the liquid coolant 18 to extract heat from the first and second heat-generating electrical components 114a-114f, 116a. The first heat-generating electrical components 114a-114f produce greater heat than the second heat-generating electrical component 116a.

Each of the first heat-generating electrical components 114a-114f functions like the first heat generating electrical component 14a discussed above, while the second heat-generating electrical component 116a functions like the second heat-generating components 16a-16f.

Figure 2B:
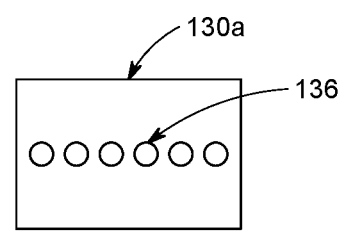
FIG. 2B is a schematic side view of a nozzle forming a plurality of apertures, according to a further embodiment.
Figure 2C:
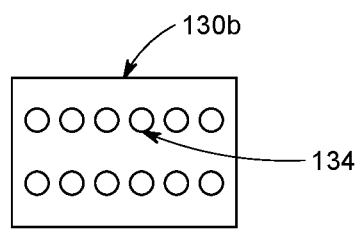
FIG. 2C is a schematic side view of a nozzle forming a plurality of apertures according to yet another embodiment.

The liquid coolant conduit 112 includes a nozzle 130 fluidly connected to the inlet 126. The nozzle 130 is located within the enclosed space 120 as shown in FIG. 2A. The nozzle 130 forms a first set of apertures 134 (FIG. 2C) and a second set of apertures 136 (FIG. 2B). The second set of apertures 136 directs the liquid coolant 18 from the nozzle 130 to the second heat-generating electrical component 116a. This is depicted using liquid flow arrow D in FIG. 2A. The first set of apertures 134 directs the liquid coolant 18 from the nozzle 130 to the first heat-generating electrical components 114a-114f. Specifically, the nozzle 130 has a front side 130a, a first side 130b, and the second side 130c. The front side 130a forms the second set of apertures 136 (FIG. 2B), while the first side 130b forms the first set of apertures 134 (FIG. 2C). The second side 130c forms a third set of apertures (not shown) that is identical to the second set of apertures 136. This is shown as respective liquid flow arrows E, F in FIG. 2A. It is contemplated that the first, second and third sides may form different configurations of apertures in another embodiment.

The nozzle 130 is configured and designed to adjust the flow rate of the liquid coolant 18 into the first heat-generating electrical components 114a-114f and into the second heat-generating electrical component 116a. More specifically, the nozzle 130 is configured and located to allow the liquid coolant 18 to pass the first heat-generating electrical components 114a-114f at a faster rate than the second heat-generating electrical component 116a. The nozzle 130 assists the liquid cooling system 110 in saving or reducing power to achieve cooling of the first and second heat-generated electrical components 114a-114f, 116a.

Referring back to FIG. 2C, the first set of apertures 134 includes exactly 14 generally circular apertures. The first set of apertures generally includes from about 10 to about 20 apertures, and generally from about 10 to about 16 apertures. Referring back to FIG. 2B, the second set of apertures 136 includes exactly 6 generally circular apertures. The second and third sets of apertures generally includes from about 3 to about 8 apertures and generally from about 4 to about 8 apertures. It is contemplated that the number of first, second and third sets of apertures may vary in number. As discussed above with respect to the first and second set of apertures 34, 36 (see FIGS. 1B and 1C), the first and second set of apertures 134, 136 formed in the nozzle 130 may also be formed in different shapes and sizes than depicted in FIGS. 2B and 2C.

Figure 3:
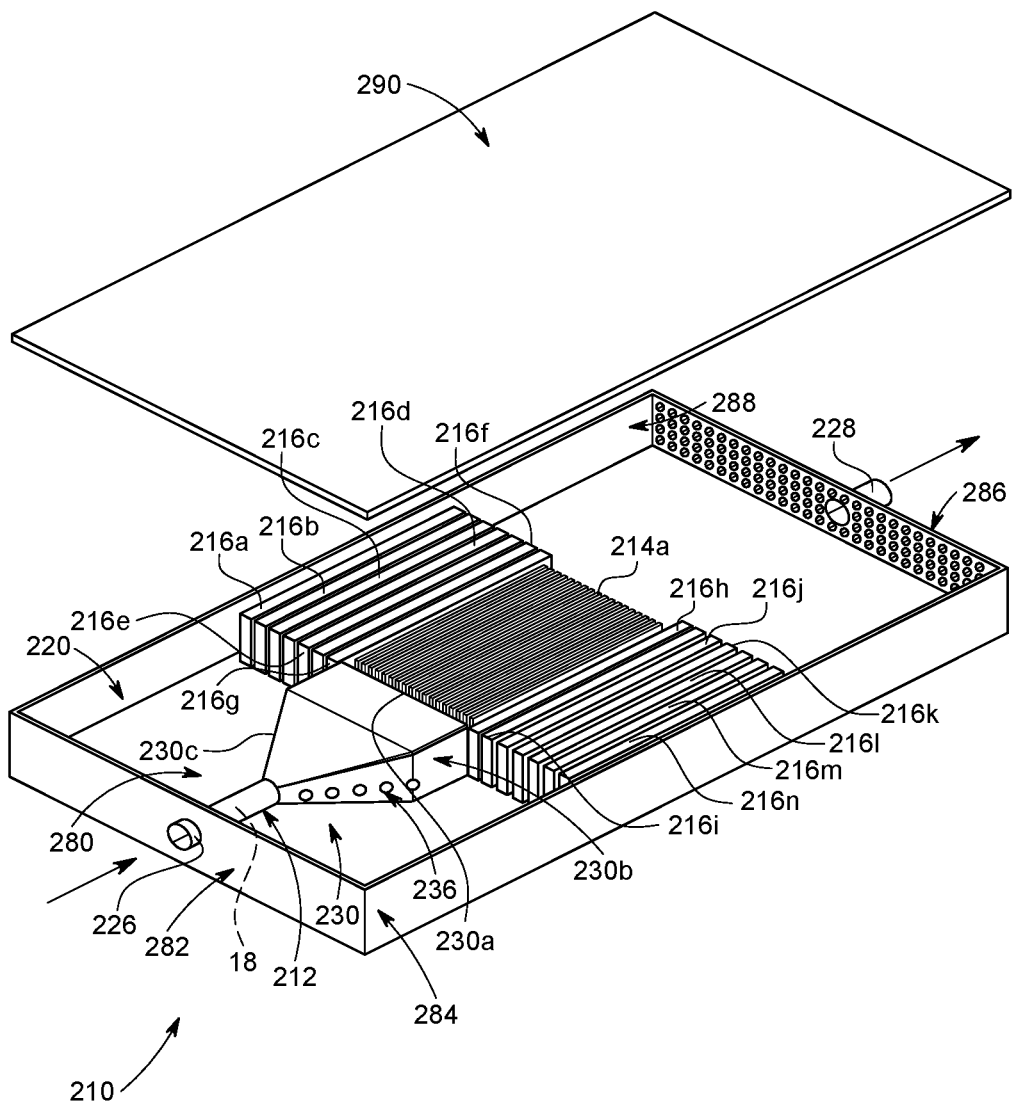
FIG. 3 is a top perspective exploded view of a liquid cooling system, according to a further embodiment.

Referring to FIG. 3, a top perspective exploded view of a liquid cooling system 210 is shown according to a further embodiment. The liquid cooling system 210 includes a liquid coolant conduit 212. The liquid coolant conduit 212 is in proximity to a first heat-generating electrical component 214a and second heat-generating electrical components 216a-216n contained within an enclosed space 220. The enclosed space 220 includes an inlet 226 and a tray outlet 228. FIG. 3 shows the tray outlet 228 with a plurality of hexagonal apertures formed therein that are later consolidated with each other. The enclosed space 220 is formed using a bottom 280, a plurality of walls 282, 284, 286, 288, and a top cover 290.

The liquid coolant conduit 212 allows circulation of the liquid coolant 18 to extract heat from the first and second heat-generating electrical components 214a, 216a-216n. The first heat-generating electrical component 214a produces greater heat than each of the second heat-generating electrical components 216a-216n. The first and second heat-generating electrical components 214a, 216a-216n are similar to the first and second heat-generating electrical components 14a, 16a-16f, respectively, discussed above The liquid coolant conduit 212 includes a nozzle 230 fluidly connected to the inlet 226. The nozzle 230 is located within the enclosed space 220 as shown in FIG. 3. The nozzle 230 functions similarly to the nozzle 30 discussed above. The nozzle 230 includes a front side 230a, a first side 230b, and a second side 230c. The nozzle 230 forms a second set of apertures 236 in the first and second sides 230b, 230c (only apertures in the first side 230b shown) that directs the liquid coolant 18 to the second heat-generating components 216a-216n. The first set of apertures (not shown) of the nozzle 230 directs the liquid coolant 18 to the first heat-generating component 214a.

Figure 4:
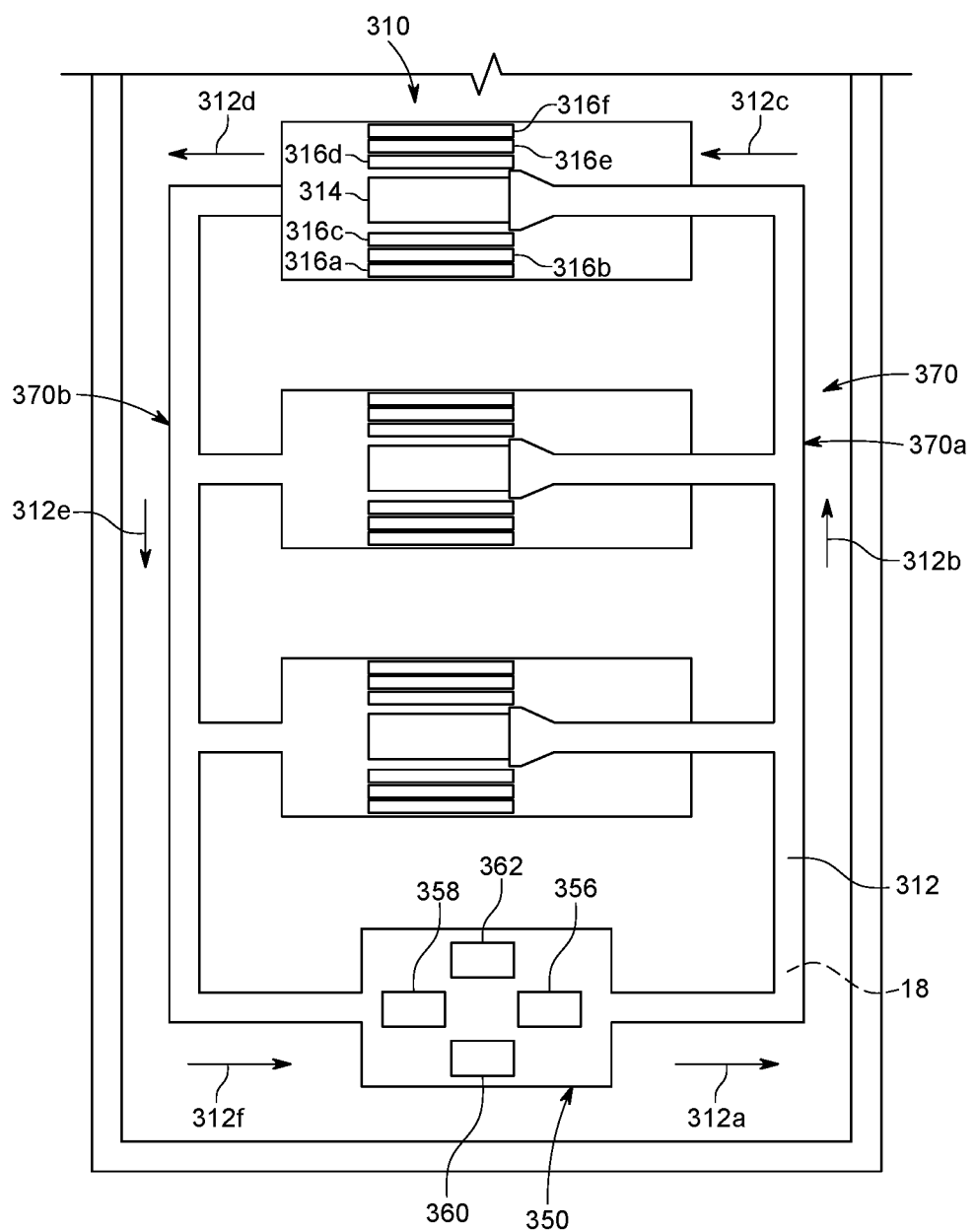
FIG. 4 is a schematic side view of a closed-loop liquid cooling system, according to one embodiment of the present disclosure.

Referring to FIG. 4, a schematic side view of a liquid cooling system 310 according to one embodiment. The liquid cooling system 310 is a closed-loop liquid cooling system. The closed-loop liquid cooling system 310 includes a liquid coolant conduit 312, first and second heat-generating electrical components 314, 316a-316f, a coolant distribution unit (CDU) 350, and a rack manifold 370. The rack manifold 370 includes a first manifold portion 370a and a second manifold portion 370b. The closed-loop liquid cooling system 310 uses heat exchange to cool hot water, which is heated from the heat source (the first and second heat-generating electrical components 314, 316a-316f). Liquid coolant 18 is contained within the liquid coolant conduit 312 and is circulated to extract heat from the first and second heat-generating electrical components 314, 316a-316f. The liquid coolant conduit 312 is located in proximity to the first and second heat-generating electrical components 314, 316a-316f.

The liquid coolant conduit 312 carries the liquid coolant 18 to the first and second heat-generating electrical components 314, 316a-316f. Heat generated by the first and second heat-generating electrical components 314, 316a-316f is transferred to the liquid coolant 18. The liquid coolant conduit 312 carries the liquid coolant 18 (heated) away from the first and second heat-generating electrical components 314, 316a-316f. The path of the liquid coolant 18 in the liquid coolant conduit 312 is shown generally in FIG. 4 with arrows 312a-312f. The arrow 312a shows the liquid coolant 18 (cooled) immediately after leaving the coolant distribution unit 350. The arrow 312b shows the liquid coolant 18

(which is still cooled) being distributed in the first manifold portion 370a after leaving the coolant distribution unit 350. The arrows 312c, 312d show the path of the liquid coolant 18 before and after being heated by the first and second heat-generating electrical components 314, 316a-316f. The arrow 312e shows the path of the liquid coolant 18 (heated) returning to the second manifold portion 370b, while the arrow 312f shows the liquid coolant 18 (heated) immediately before returning to the coolant distribution unit 350.

Referring still to FIG. 4, the coolant distribution unit (CDU) 350 includes at least one pump 356 configured to transport the liquid coolant 18 in the liquid coolant conduit 312, a heat exchanger 358 coupled to the liquid coolant conduit 312 to extract heat therefrom, and a control system 360 that assists in controlling the process of the closed-loop liquid cooling system 310. The coolant distribution unit 350 typically includes an air flow system 362 operable to propel ambient air through the heat exchanger 358.

In one embodiment, the heat exchanger 358 is fluidly coupled to the liquid coolant conduit 312 to extract heat therefrom. The heat exchanger also typically includes a manifold and a plurality of tubes (not shown), which assist in efficient cooling of the liquid coolant 18 (heated). There may be exactly one heat exchanger or a plurality of heat exchangers.

It is contemplated that the components of the coolant distribution unit (CDU) may be placed in separate locations within the closed-loop liquid cooling system. For example, a pump may not be located within the housing of the coolant distribution unit in another embodiment.

Figure 5:
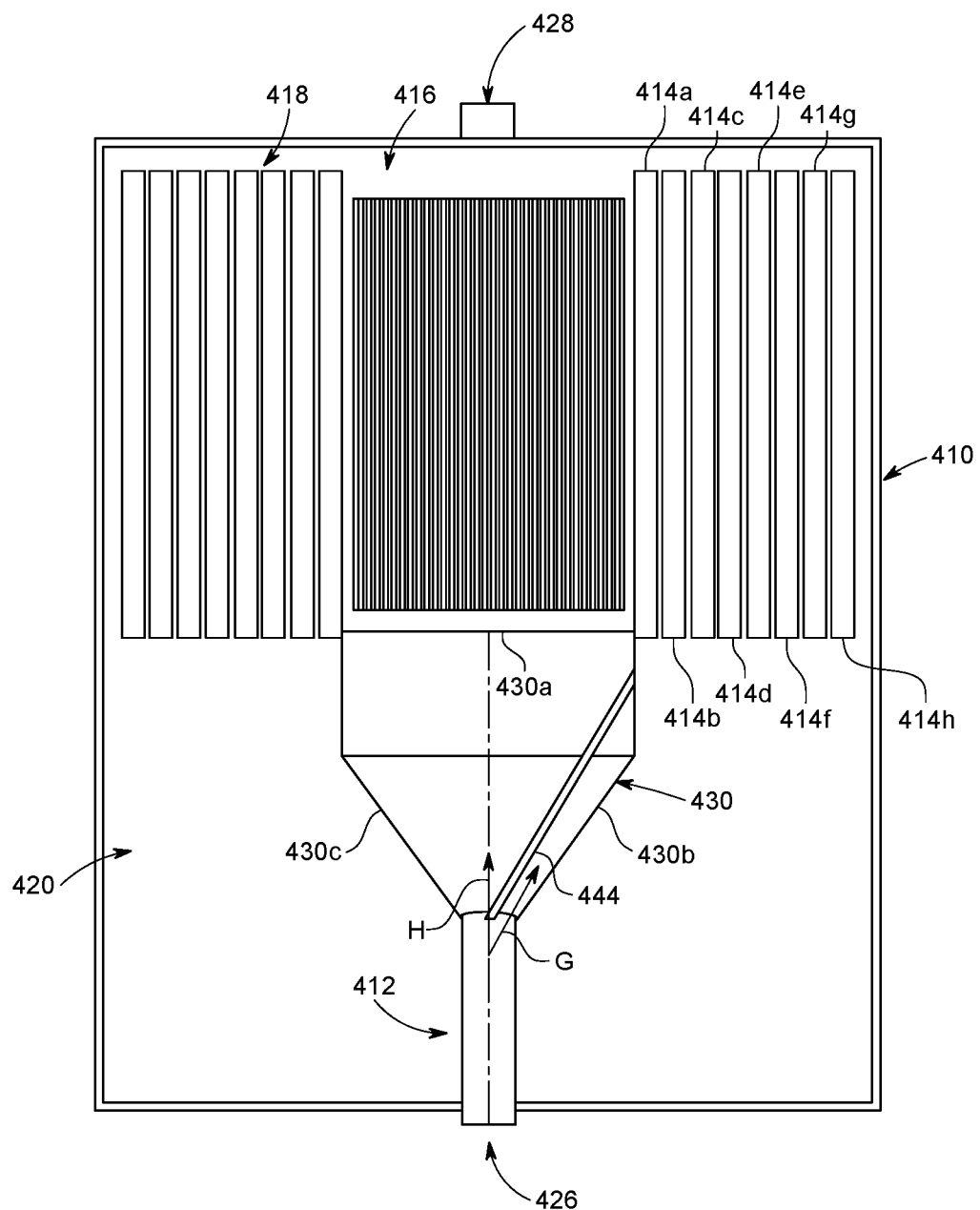
FIG. 5 is a schematic top view of a liquid cooling system, according to another yet a further embodiment.

Referring to FIG. 5, a schematic top view of a liquid cooling system 410 is shown according to yet a further embodiment. The liquid cooling system 410 includes a liquid coolant conduit 412. The liquid coolant conduit 412 is in proximity to first heat-generating electrical components 414a-414h and a plurality of second heat-generating electrical components 416, 418 contained within an enclosed space 420. The enclosed space 420 includes an inlet 426 and an outlet 428.

The liquid coolant conduit 412 allows circulation of the liquid coolant 18 to extract heat from the first and second heat-generating electrical components 414a-114h, 416, 418. The first heat-generating electrical components 414a-414h produce greater heat than the second heat-generating electrical components 416, 418.

Each of the first heat-generating electrical components 414a-414h functions like the first heat generating electrical component 14a discussed above, while the second heat-generating electrical components 416, 418 function like the second heat-generating components 116a-116f.

The liquid coolant conduit 412 includes a nozzle 430 fluidly connected to the inlet 426. The nozzle 430 is located within the enclosed space 420 as shown in FIG. 5. The nozzle 430 has a front side 430a and a plurality of sides 430b, 430c. The nozzle 430 includes a partition 444 that assists in diverting more liquid coolant 18 to the first heat-generating electrical components 414a-414h. In one embodiment, the front side 430a and the side 430c form a second set of apertures (see, e.g., plurality of apertures 36 in FIG. 1C), while the side 430b forms a first set of apertures (see, e.g., plurality of apertures 34 in FIG. 1B). The apertures of the front side 430a direct the liquid coolant 18 to the second heat-generating electrical components 416, while the apertures on the side 430c direct the liquid coolant 18 to the second heat-generating electrical components 418. The partition 444 allows a more concentrated flow of the liquid coolant 18 to contact the first heat-generating electrical components 414a-414h. This is depicted by liquid flow arrow G in FIG. 5, while the remainder of the flow follows liquid flow arrow H. It is contemplated that the apertures of the front side 430a may be different from the apertures of the side 430c.

The liquid coolant 18 may be selected from a variety of coolants to assist in removing heat generated from the first and second heat-generating electrical components described above. In one embodiment, the liquid coolant 18 is a thermally-conductive, dielectric liquid coolant. The liquid coolant 18 assists in removing heat generated from the first and second heat-generated electrical components. Non-limiting examples of coolants include fluorocarbons, water (e.g., deionized water, mixtures including water), and hydrocarbons. It is contemplated that other coolants may be used that can remove and absorb heat from the plurality of heat-generating electrical components.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A liquid cooling system comprising:
a liquid coolant conduit in proximity to a plurality of heat-generating electrical components contained within an enclosed space, the liquid coolant conduit allowing circulation of a liquid coolant to extract heat from the plurality of heat-generating electrical components, the plurality of heat-generating electrical components including at least one first heat-generating electrical component and at least one second heat-generating electrical component, the at least one first heat-generating electrical component producing greater heat than the at least one second heat-generating electrical component, the enclosed space including an inlet and an outlet,
wherein the liquid coolant conduit includes a nozzle fluidly connected to the inlet, the nozzle located within the enclosed space, the nozzle forming a first set of at least one aperture and a second set of at least one aperture, the first set of at least one aperture directing the liquid coolant to the at least one first heat-generating electrical component, the second set of at least one aperture directing the liquid coolant to the at least one second heat-generating component, the nozzle being configured and located to allow liquid coolant to pass the at least one first heat-generating electrical component at a faster rate than the at least one second heat-generating electrical component.

2. The liquid cooling system of claim 1, wherein the first set of at least one aperture is a plurality of apertures, and the second set of at least one aperture is a plurality of apertures.

3. The liquid cooling system of claim 2, wherein the first set of at least one aperture has a greater number of apertures than the second set of at least one aperture.

4. The liquid cooling system of claim 2, wherein the first set of at least one aperture has from about 10 to about 20 apertures.

5. The liquid cooling system of claim 2, wherein the second set of at least one aperture has from about 3 to about 8 apertures.

6. The liquid cooling system of claim 2, wherein the first set of at least one aperture is a non-polygonal shape.

7. The liquid cooling system of claim 2, wherein the first set of at least one aperture is a polygonal shape.

8. The liquid cooling system of claim 2, wherein the at least one first heat-generating electrical component produces from about 3 to about 300 times as much heat than the at least one second heat-generating electrical component.

9. The liquid cooling system of claim 8, wherein the at least one first heat-generating electrical component produces from about 5 to about 50 times as much heat than the at least one second heat-generating electrical component.

10. The liquid cooling system of claim 1, wherein the nozzle includes a partition.

11. A computer system comprising:
a plurality of heat-generating electrical components including at least one first heat-generating electrical component and at least one second heat-generating electrical component; and
a liquid cooling system comprising a liquid coolant conduit in proximity to the plurality of heat-generating electrical components contained within an enclosed space, the liquid coolant conduit allowing circulation of a liquid coolant to extract heat from the plurality of heat-generating electrical components, the at least one first heat-generating electrical component producing greater heat than the at least one second heat-generating electrical component, the enclosed space including an inlet and an outlet,
wherein the liquid coolant conduit includes a nozzle fluidly connected to the inlet, the nozzle located within the enclosed space, the nozzle forming a first set of at least one aperture and a second set of at least one aperture, the first set of at least one aperture directing the liquid coolant to the at least one first heat-generating electrical component, the second set of at least one aperture directing the liquid coolant to the at least one second heat-generating component, the first set of at least one aperture allowing the liquid coolant to pass the at least one first heat-generating electrical component at a faster rate than the second set of at least one aperture allows the liquid coolant to pass the at least one second heat-generating electrical component.

12. The computer system of claim 11, wherein the plurality of heat-generating electrical components is a plurality of servers.

13. The computer system of claim 11, wherein the first set of at least one aperture is a plurality of apertures, and the second set of at least one aperture is a plurality of apertures.

14. The computer system of claim 13, wherein the first set of at least one aperture has a greater number of apertures than the second set of at least one aperture.

15. The computer system of claim 13, wherein the first set of at least one aperture has from about 10 to about 20 apertures.

16. The computer system of claim 13, wherein the second set of at least one aperture has from about 3 to about 8 apertures.

17. The computer system of claim 11, wherein the at least one first heat-generating electrical component produces from about 3 to about 100 times as much heat than the at least one second heat-generating electrical component.

18. The computer system of claim 11 further including a liquid coolant.

19. The computer system of claim 11, wherein the nozzle further includes a partition.

* * * * *